United States Patent
Uhlenbrock et al.

(10) Patent No.: US 6,495,459 B2
(45) Date of Patent: *Dec. 17, 2002

(54) SOLUTIONS OF METAL-COMPRISING MATERIALS, METHODS OF FORMING METAL-COMPRISING LAYERS, METHODS OF STORING METAL-COMPRISING MATERIALS, AND METHODS OF FORMING CAPACITORS

(75) Inventors: Stefan Uhlenbrock, Boise, ID (US); Brian A. Vaartstra, Nampa, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/999,840

(22) Filed: Oct. 24, 2001

(65) Prior Publication Data

US 2002/0055242 A1 May 9, 2002

Related U.S. Application Data

(63) Continuation of application No. 09/253,307, filed on Feb. 19, 1999, now Pat. No. 6,319,832.

(51) Int. Cl.[7] ................................................. H01L 21/44
(52) U.S. Cl. ........................ 438/681; 438/393; 438/396; 427/255
(58) Field of Search ................................. 438/393, 396, 438/399, 680, 681; 427/248.1, 255.12, 255.2, 250, 255

(56) References Cited

U.S. PATENT DOCUMENTS

| | | | |
|---|---|---|---|
| 5,820,664 A | 10/1998 | Gardiner et al. | |
| 5,874,131 A | 2/1999 | Vaartstra et al. | |
| 5,919,522 A | 7/1999 | Baum et al. | |
| 6,130,160 A | 10/2000 | Vaartstra | |
| 6,277,436 B1 | 8/2001 | Stauf et al. | |
| 6,319,832 B1 * | 11/2001 | Uhlenbrock et al. | 438/681 |

* cited by examiner

Primary Examiner—Kevin M. Picardat
(74) Attorney, Agent, or Firm—Wells St. John P.S.

(57) ABSTRACT

In one aspect, the invention encompasses a semiconductor processing method of forming a metal-comprising layer over a substrate. A substrate is provided within a reaction chamber, and a source of a metal-comprising precursor is provided external to the reaction chamber. The metal-comprising precursor comprises a metal coordinated with at least one Lewis base to form a complex having a stoichiometric ratio of the at least one Lewis base to the metal. An amount of the at least one Lewis base is distributed within the source to an amount that is in excess of the stoichiometric ratio. At least some of the metal-comprising precursor is transported from the source to the reaction chamber. A metal is deposited from the metal-comprising precursor and onto the substrate within the reaction chamber. In another aspect, the invention encompasses a method of storing a metal-comprising material. A metal-comprising material is dispersed within a solution. The metal-comprising material comprises a complex having the stoichiometric form $(Y)_xM(Q)_z$; wherein M is a metal, Y is a first ligand, x is from 0 to 4, Q is a Lewis base, and z is from 1 to 6. An amount of Q is dispersed within the solution to an excess over the stoichiometric ratio of Q to M in the complex.

26 Claims, 3 Drawing Sheets

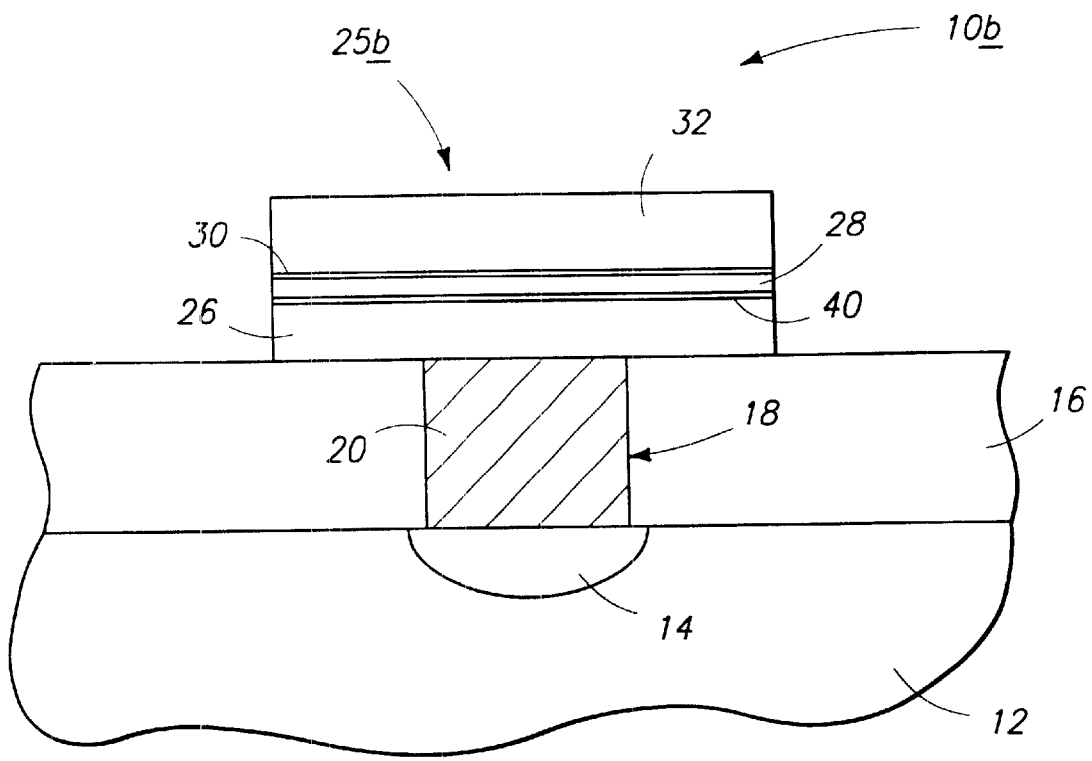
$$\boxed{\text{F I G}}\ 4$$

SOLUTIONS OF METAL-COMPRISING MATERIALS, METHODS OF FORMING METAL-COMPRISING LAYERS, METHODS OF STORING METAL-COMPRISING MATERIALS, AND METHODS OF FORMING CAPACITORS

CROSS REFERENCE TO RELATED APPLICATION

This application is a continuation of U.S. patent application Ser. No. 09/253,307, which was filed on Feb. 19, 1999, now U.S. Pat. No. 6,319,832, and which is incorporated by reference herein.

TECHNICAL FIELD

In one aspect, the invention pertains to methods of forming semiconductor circuit constructions, such as, for example, methods of forming capacitor constructions. In particular embodiments, the invention pertains to methods of forming capacitor constructions comprising diffusion barrier layers. In other aspects, the invention pertains to solutions of metal-comprising materials, and to methods of storing metal-comprising materials.

BACKGROUND OF THE INVENTION

As DRAMs increase in memory cell density, there is a continuing challenge to maintain sufficiently high storage capacitance despite the continuing goal to further decrease cell area. One principal way of increasing cell capacitance is through cell structure techniques. Such techniques include three-dimensional cell capacitors, such as trenched or stacked capacitors. Yet as feature size continues to become smaller and smaller, development of improved materials for cell dielectrics as well as the cell structure are important. The feature size of 256 Mb DRAMs is on the order of 0.25 micron, and conventional dielectrics such as $SiO_2$ and $Si_3N_4$ might not be suitable because of small dielectric constants.

Chemical vapor deposited oxide films, such as, for example tantalum oxide ($Ta_2O_5$), $BaTiO_3$ and $SrTiO_3$ films are considered to be very promising cell dielectric layers. For instance, the dielectric constant of $Ta_2O_5$ is approximately three times that of $Si_3N_4$. Capacitor constructions have been proposed and fabricated to include the use of one or more of the oxide materials as a capacitor dielectric layer. However, diffusion relative to the oxide materials can be problematic in the resultant capacitor constructions. For example, tantalum from $Ta_2O_5$ tends to undesirably outdiffuse from dielectric layers comprising tantalum oxide. Further, materials from the adjacent conductive capacitor plates can diffuse into the tantalum-comprising dielectric layers. In either event, the dielectric properties of the dielectric layer are adversely affected in a less than predictable or an uncontrollable manner.

A method of inhibiting diffusion between tantalum oxide and adjacent materials is to surround the tantalum oxide with a material that constitutes a diffusion barrier layer. Suitable materials for utilization as diffusion barrier layers are materials comprising transition metals (such as, for example, ruthenium, osmium, rhodium, iridium and cobalt), and can include transition metal oxides (such as, for example, ruthenium oxide, osmium oxide, rhodium oxide, iridium oxide and cobalt oxide). The transition metals are typically deposited by chemical vapor deposition (CVD) utilizing metal-comprising precursor compounds. The metal-comprising precursor compounds generally comprise a transition metal coordinated with one or more Lewis base ligands in the form of a complex. Exemplary metal-comprising precursors are (cyclopentadienyl)Rh(CO)$_2$, and (1,3-cyclohexadiene)Ru(CO)$_3$. During a CVD process, the metal-comprising precursors are provided in a reaction chamber with a substrate and subjected to temperature and pressure conditions (and, in some instances, to a plasma or photolysis) to decompose the precursor and cause release of metal from the precursor. The released metal is then deposited on the substrate. A difficulty in utilizing the above-describe metal-comprising precursors in CVD processes is that the precursors frequently decompose prematurely. Such decomposition can occur while the precursors are stored outside the chamber and can result in formation of dimers or molecular clusters of the transition metal precursors. The resulting materials comprising dimers or molecular clusters are generally less volatile than are the original metal-comprising precursors, and accordingly can be difficult to utilize in CVD processes. It would be desirable to develop methods for CVD of metal-comprising precursors which avoid the above-described difficulties.

SUMMARY OF THE INVENTION

In one aspect, the invention encompasses a semiconductor processing method of forming a metal-comprising layer over a substrate. A substrate is provided within a reaction chamber, and a source of a metal-comprising precursor is provided external to the reaction chamber. The metal-comprising precursor comprises a metal coordinated with at least one Lewis base to form a complex having a stoichiometric ratio of the Lewis base to the metal. An amount of the Lewis base is provided within the source to an excess of the stoichiometric ratio. At least some of the metal-comprising precursor is transported from the source to the reaction chamber. A metal is deposited from the metal-comprising precursor and onto the substrate within the reaction chamber.

In another aspect, the invention encompasses a method of storing a metal-comprising material. A metal-comprising material is dispersed within a solution. The metal-comprising material comprises a complex having the stoichiometric form $(Y)_xM(Q)_z$; wherein M is a metal, Y is a first ligand, x is from 0 to 4, Q is a Lewis base, and z is from 1 to 6. An amount of Q is dispersed within the solution to an excess over the stoichiometric ratio of Q to M in the complex.

In yet another aspect, the invention encompasses a method of forming a capacitor. A first capacitor electrode is formed over a substrate. A diffusion barrier layer is formed proximate the first capacitor electrode. A dielectric layer is formed. The dielectric layer is separated from the first capacitor electrode by the diffusion barrier layer. A second capacitor electrode is formed. The second capacitor electrode is separated from the first electrode by the dielectric layer. The forming the diffusion barrier layer comprises the following steps. The substrate having the first capacitor electrode thereover is provided to within a reaction chamber. A source of a metal-comprising precursor is provided external to the reaction chamber. The metal-comprising precursor comprises a metal coordinated with one or more Lewis bases to form a complex having a stoichiometric ratio of the Lewis bases to the metal. At least some of metal-comprising precursor in the source is a liquid. A gas is provided, and an amount of at least one of the Lewis bases is distributed within the gas. After the Lewis base is distributed within the gas, the gas is passed through the liquid metal-comprising precursor of the source. At least some of the metal-comprising precursor from the source is transported to the reaction chamber with the gas. A metal-containing film is deposited from the metal-comprising precursor onto the substrate.

BRIEF DESCRIPTION OF THE DRAWINGS

Preferred embodiments of the invention are described below with reference to the following accompanying drawings.

FIG. 4 is a diagrammatic, sectional view of yet another alternate embodiment semiconductor wafer fragment in accordance with an aspect of the invention.

DETAILED DESCRIPTION OF THE PREFERRED EMBODIMENTS

Figure 1:
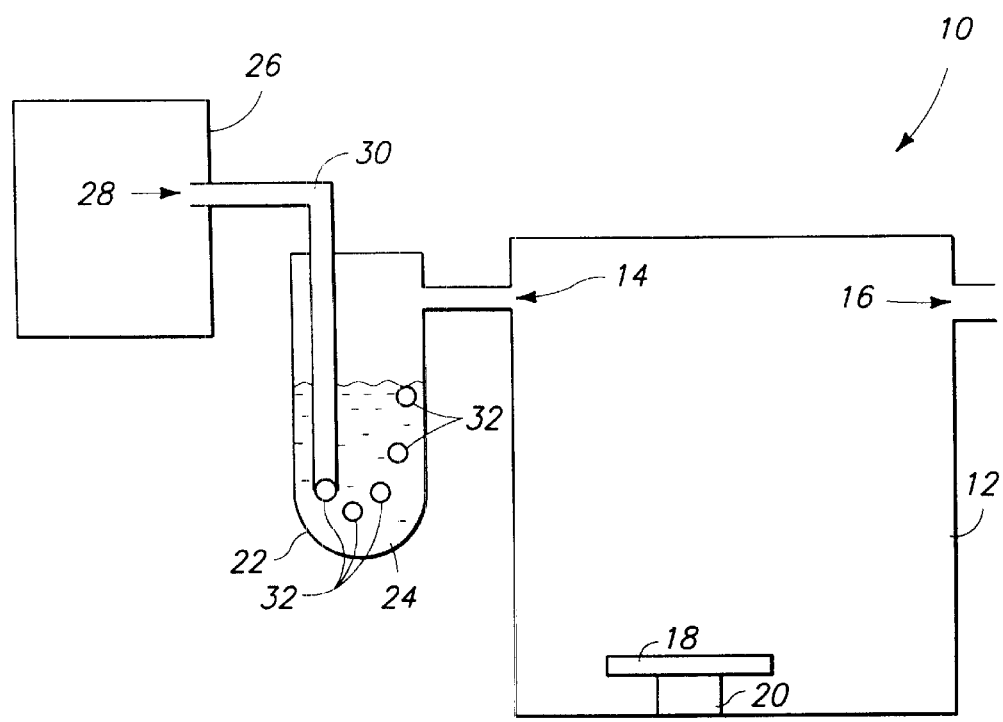
FIG. 1 is diagrammatic, sectional view of a reaction chamber system configured in accordance with an aspect of the present invention.

This disclosure of the invention is submitted in furtherance of the constitutional purposes of the U.S. Patent Laws "to promote the progress of science and useful arts" (Article 1, Section 8).

In one aspect, the invention encompasses an improved method for forming a metal-comprising layer over a substrate. The metal-comprising precursor includes complexes wherein metal atoms are coordinated with one or more Lewis bases. The ratio of the molar amount of Lewis base ligands bound in complexes with metal to the molar amount of metal bound in such complexes is referred to herein as a stoichiometric ratio. The metal-comprising precursor is provided within a source vessel which further includes an amount of the Lewis base distributed therein that is in excess of the stoichiometric ratio. The excess Lewis base reduces a rate of decomposition of the metal-comprising precursor. In an exemplary application of the present invention, excess carbon monoxide was added to a solution of tricarbonyl(1,3-cyclohexadiene)ruthenium (CHDR). Specifically, a gaseous mixture of carbon monoxide and helium was bubbled through liquid CHDR, with the carbon dioxide being provided to 5% (by volume) in the gaseous mixture. No signs of decomposition were detected after 7 days at 45° C. A control solution to which excess carbon monoxide was not added showed substantial decomposition of CHDR after just five hours.

A proposed mechanism for the reduction in a metal-comprising precursor decomposition rate by a method of the present invention is as follows. First, it is recognized that a metal-comprising precursor can be subject to the equilibria of equations 1, 2 and 3.

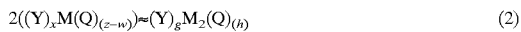

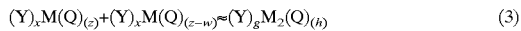

In equation 1, "M" is a metal, "Y" is a first ligand and "Q" is a Lewis base. Exemplary stoichiometries include "x" being from 0 to 4 (in particular aspects "x" is an integer from 0 to 4), "z" being from 1 to 6 (in particular aspects "z" is an integer from 1 to 6), and "w" being from 1 to 6 (in particular aspects "w" is an integer from 1 to 6). The equilibrium of equation 1 interconverts an undissociated metal-comprising precursor $((Y)_xM(Q)_z)$ with a decomposed form $((Y)_xM(Q)_{(z-w)})$ of the metal-comprising precursor. The equilibria of equations 2 and 3 form dimers or larger molecular clusters. In equations 2 and 3, an exemplary value of "g" is "2x", and exemplary values of "h" are from "(2z-w)" to "2(z-w)".

The dimers or molecular clusters of equations 2 and 3 can be less volatile than the starting metal-comprising precursor, and are therefore undesired. In accordance with the present invention, the addition of excess Lewis base (for example, excess "Q") to a solution comprising the metal-comprising precursor can reduce the equilibrium amount of dimers and molecular clusters. Specifically, addition of excess Lewis base to a source of metal-comprising precursor pushes equilibrium 1 to the left, to thereby reduce a concentration of decomposed precursor within the source solution. The reduction in concentration of decomposed precursor reduces the amount of precursor involved in equilibria 2 and 3, and accordingly avoids dimer and molecular cluster formation. The above-described mechanism for reduction in dimer and molecular cluster formation is provided to possibly assist a reader in understanding a method of the present invention, and is not intended to limit the scope of the invention except to the extent that the mechanism is explicitly recited in the claims that follow.

A specific method of the present invention is described with reference to a CVD system 10 in FIG. 1. CVD system 10 comprises a reaction chamber 12 having an inlet 14 and an outlet 16. A semiconductive wafer substrate 18 is provided within chamber 12, and held by a wafer holder 20.

CVD system 10 further comprises a vessel 22 provided externally to reaction chamber 12. In the shown embodiment, vessel 22 contains a liquid 24 which comprises a metal-comprising precursor, and is thus a source of metal-comprising precursor. It is noted that the invention encompasses other embodiments (not shown) wherein the precursor is a solid or gas. In the shown embodiment, the source 24 can be either a solution comprising the metal-comprising precursor or can be neat metal-comprising precursor. The metal-comprising precursor includes a metal coordinated with one or more Lewis bases to form a complex having a stoichiometric ratio of the Lewis bases to the metal. The metal-comprising precursor can comprise, for example, a complex having the formula of $(Y)_xM(Q)_z$ wherein "M" is the metal, "Y" is a first ligand and "Q" is a Lewis base. Exemplary stoichiometries include "x" being from 0 to 4, and "z" being from 1 to 6. In exemplary embodiments, metal "M" is a transition metal, and can comprise, for example, a metal selected from the group consisting of Ru, Os, Rh, Ir and Co. Also in exemplary embodiments, "Y" is a multidentate chelate, such as, for example, cyclopentadienyl, 1,3-cyclohexadiene or derivatives of cyclodienes (such as, for example, methyl cyclopentadienyl). Further in exemplary embodiments, "Q" is selected from the group consisting of CO and $NH_3$. Alternatively, "Q" can comprise an organic material having a double bond that joins a pair of carbon atoms.

The source 24 is preferably maintained at a temperature and pressure sufficient to enable the metal-comprising precursor to be volatilized and transported by the gas flowing through source 24. The temperature is preferably from about 0° C. to about 100° C., more preferably from about 0° C. to about 50° C., and most preferably from about 20° to about 40° C. The pressure is preferably from about 0.1 to about 760 Torr, more preferably from about 0.1 to about 100 Torr, and most preferably from about 0.5 to about 50 Torr.

A second vessel 26 is provided in system 10, and is a source of a gas. Second vessel 26 has an outlet 28 which leads to a passageway 30 for directing a gas from vessel 26 into source 24. The gas forms bubbles 32 within the liquid and transports at least some of the metal-comprising precursor from source 24 into reaction chamber 12. Preferably, the gas within vessel 26 comprises at least one of Lewis bases coordinated in the metal-comprising precursor within source 24. For instance, if the metal-comprising precursor is (cyclopentadienyl)Rh(CO)$_2$, or (1,3-cyclohexadiene)Ru(CO)$_3$, the gas preferably comprises CO. Accordingly, as the gas is flowed into vessel 22 it distributes CO within source 24 to an amount in excess of the stoichiometric ratio of CO in the metal-comprising precursor complex. The CO can be distributed homogeneously throughout source 24, or can be distributed as a concentration gradient within source 24. The metal-comprising precursor vapor that is transported into vessel 12 is subjected to temperature and pressure conditions suitable for depositing a layer comprising the metal onto substrate 18.

The gas in vessel 26 can consist essentially of components that are Lewis base ligands in a metal-comprising precursor complex (for example, the gas can consist essentially of CO when the metal-comprising precursor includes CO ligands), or can comprise a mixture of components that are Lewis base ligands and other gaseous components (such other components can be, for example, so-called "inert" gases, such as argon, helium or nitrogen). Preferably, the concentration of the Lewis base ligand components within the gas mixture is from about 0.01% to about 100%, more preferably from about 0.1% to about 5%, and most preferably from about 1% to about 2% (wherein the percentages are volume percent). Also, the gas can comprise materials that include a particular Lewis base, rather than, or in addition to, comprising the particular Lewis base. For instance, if the Lewis base is CO, the gas can comprise RCO (wherein "R" is an organic group bonded to CO) instead of, or in addition to, CO.

It is to be understood that the metal-comprising precursors can comprise multiple different Lewis bases (for instance, the ligands identified as "Y" in the above-described precursors (Y)$_x$M(Q)$_z$ can be Lewis base ligands). By different Lewis bases, it is meant Lewis bases having different chemical formulas from one another. In accordance with the present invention, if a metal-comprising precursor comprises multiple different Lewis bases, at least one of the Lewis bases will preferably be distributed within the source to an amount in excess of the stoichiometric ratio of the Lewis base in the complex. In particular embodiments, more than one of the different Lewis bases can be distributed to amounts in excess of the stoichiometric ratio of said Lewis bases in the metal-comprising precursor complex.

Figure 2:
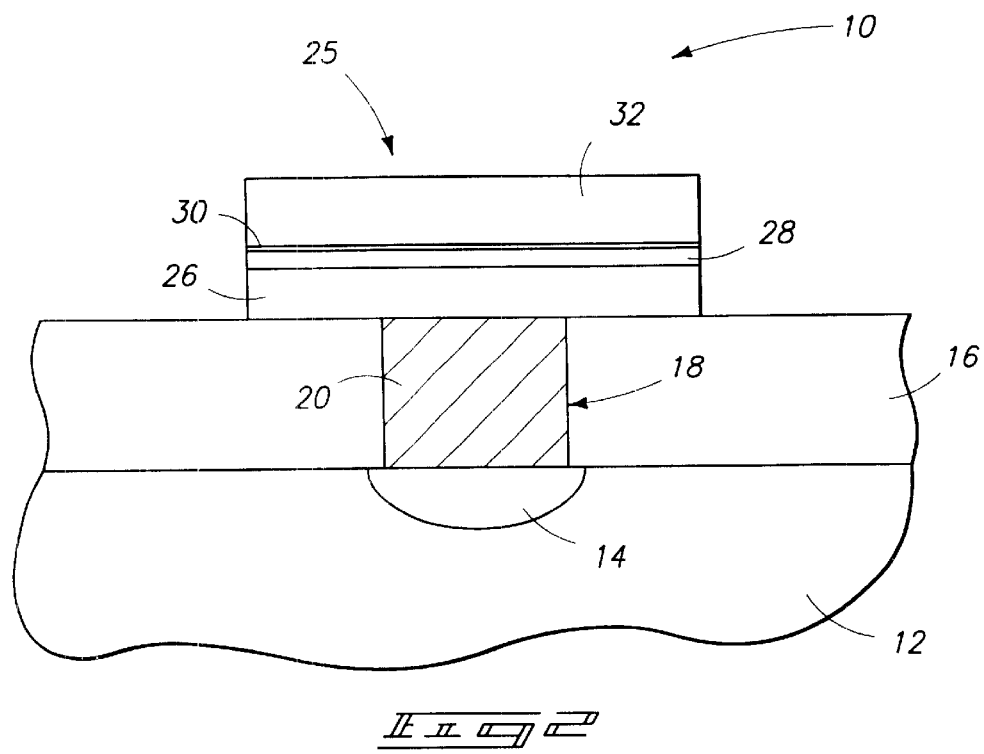
FIG. 2 is a fragmentary, diagrammatic, sectional view of a semiconductor wafer fragment in accordance with an aspect of the invention.

The method described above with reference to FIG. 1 can be utilized for forming barrier layers in capacitor constructions. Exemplary capacitor constructions are described with reference to FIGS. 2–4. Referring to FIG. 2, a semiconductor wafer fragment 10 comprises a capacitor construction 25 formed by a method of the present invention. Wafer fragment 10 comprises a substrate 12 having a conductive diffusion area 14 formed therein. Substrate 12 can comprise, for example, monocrystalline silicon. To aid in interpretation of the claims that follow, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

An insulating layer 16, typically borophosphosilicate glass (BPSG), is provided over substrate 12, with a contact opening 18 provided therein to diffusion area 14. A conductive material 20 fills contact opening 18, with material 20 and oxide layer 18 having been planarized as shown. Material 20 might be any suitable conductive material, such as, for example, tungsten or conductively doped polysilicon. Capacitor construction 25 is provided atop layer 16 and plug 20, and electrically connected to node 14 through plug 20.

Capacitor construction 25 comprises a first capacitor electrode 26 which has been provided and patterned over node 20. An example and preferred material is conductively doped polysilicon, provided to a thickness of about 1,000 Angstroms (for a 256 Mb DRAM). A capacitor dielectric layer 28 is provided over first capacitor electrode 26. Capacitor dielectric layer 28 can comprise, for example, one or both of silicon oxide and silicon nitride. Alternatively, capacitor dielectric layer 28 can comprise $Ta_2O_5$, $BaTiO_3$ and/or $SrTiO_3$. An exemplary process for depositing a layer 28 comprising $Ta_2O_5$ is low pressure chemical vapor deposition at 450° C. using $Ta(OC_2H_5)_5$ and oxygen as precursors. $Ta(OC_2H_5)_5$ can be vaporized at 170° C., and introduced into a reactor chamber using argon or another suitable carrier gas. Subsequently, densification can occur by rapid thermal annealing in a dry oxygen atmosphere at a temperature ranging from 700° C. to 900° C. Preferably, if first capacitor electrode 26 comprises polysilicon, a surface of the polysilicon is cleaned by an in situ HF dip prior to provision of $Ta_2O_5$. Rapid thermal treatments can also be carried out immediately prior to $Ta_2O_5$ deposition, such as at 900° C. for 60 seconds in $O_2$. An exemplary thickness for layer 28 in accordance with 256 Mb integration is 100 Å.

A diffusion barrier layer 30 is provided over dielectric layer 28. Diffusion barrier layer 30 comprises a metal and can be provided by CVD utilizing the CVD system and methods described above with reference to FIG. 1.

After formation of barrier layer 30, a second capacitor electrode 32 is formed over barrier layer 30 to complete construction of capacitor 25. Second capacitor electrode 32 can comprise constructions similar to those discussed above regarding first capacitor electrode 26, and can accordingly comprise, for example, conductively doped polysilicon. Diffusion barrier layer 30 preferably prevents components (such as, for example, tantalum or oxygen) from diffusing from dielectric material 28 and into electrode 32. If, for example, oxygen diffuses into a silicon-comprising electrode 32, it can undesirably form $SiO_2$, which will significantly reduce the capacitance of capacitor 25. Diffusion barrier layer 30 can also prevent diffusion of silicon from metal electrode 32 to dielectric layer 28.

Figure 3:
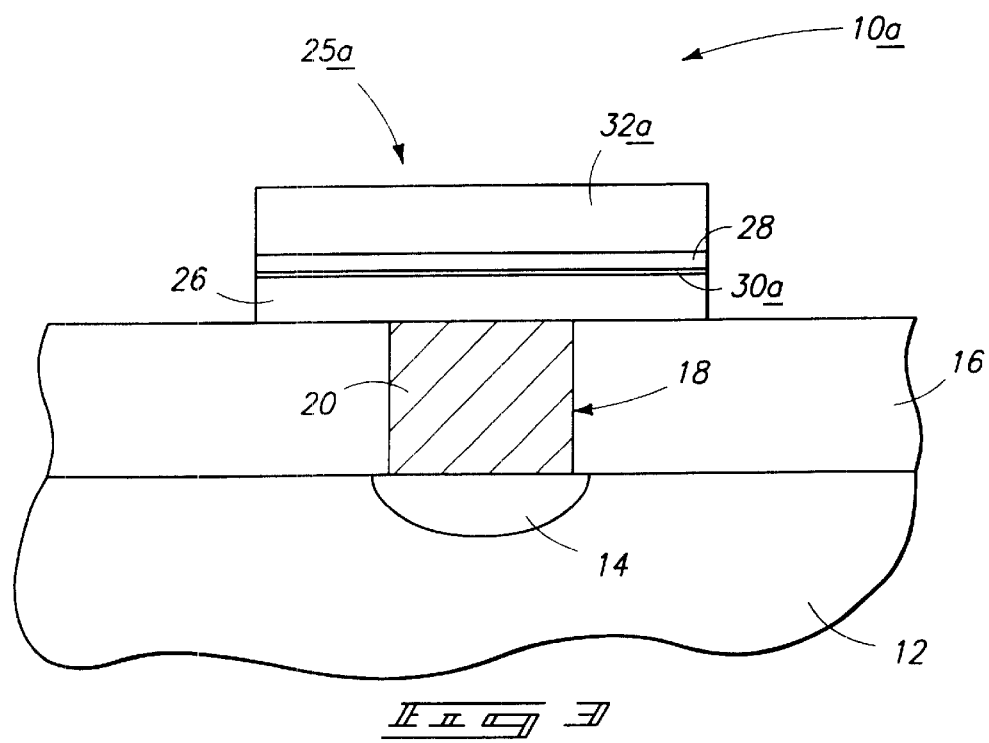
FIG. 3 is a diagrammatic, sectional view of an alternate embodiment semiconductor wafer fragment in accordance with an aspect of the invention.

FIG. 3 illustrates an alternate embodiment capacitor construction and method in accordance with the invention. Like numerals from FIG. 2 have been utilized where appropriate, with differences indicated by the suffix "a". Wafer fragment 10a comprises a capacitor construction 25a differing from the construction 25 of FIG. 2 in provision of a barrier layer 30a between first electrode 26 and dielectric layer 28, rather than between dielectric layer 28 and second capacitor electrode 32. Barrier layer 30a can comprise constructions identical to those discussed above with reference to FIG. 2.

FIG. 4 illustrates yet another alternate embodiment capacitor construction and method. Like numerals from FIG. 2 are utilized where appropriate, with differences being indicated by the suffix "b", or by different numerals. Wafer fragment 10b includes a capacitor construction 25b having the first and second capacitor plate 26 and 32, respectively, of the first described embodiment. However, wafer fragment 10b differs from wafer fragment 10 of FIG. 2 in that wafer fragment 10b comprises a second barrier layer 40 in addition to the barrier layer 30. Barrier layer 40 is provided between first capacitor electrode 26 and dielectric layer 28, whereas barrier layer 30 is between second capacitor electrode 32 and dielectric layer 28. Barrier layer 40 can be formed by methods identical to those discussed above with reference to FIG. 2 for formation of barrier layer 30.

In the embodiments of FIGS. 2–4 the barrier layers are shown and described as being distinct layers separate from the capacitor electrodes. It is to be understood, however, that the barrier layers can comprise conductive materials and can accordingly, in such embodiments, be understood to comprise at least a portion of the capacitor electrodes. In particular embodiments an entirety of a capacitor electrode can be comprised of conductive barrier layer materials.

Although the invention has been described above with reference to methods of transporting a metal-comprising precursor to a reaction chamber (FIG. 1), it is to be understood that the invention also has application to methods of storing metal-comprising materials. Specifically, a metal-comprising material which includes a metal coordinated with at least one Lewis base ligand to form a complex having a stoichiometric ratio of the Lewis base ligand to the metal can be stored in accordance with the present invention as follows. The metal-comprising material is dispersed within a solution, and an amount of the Lewis base is also dispersed within the solution, with the amount of the Lewis base being provided to be in excess of the stoichiometric ratio of Lewis base in the complex. The solution can be a mixture comprising the metal-comprising material or can be a neat liquid of the material. In a particular aspect of the invention, the solution can be a liquid which is sealed in a gas-tight vessel. The gas-tight vessel can have a head-space over the liquid, and the head-space can contain a gas. The excess Lewis base can be provided within the gas in the head-space, and the dispersing of the Lewis base into the solution can comprise diffusion of the Lewis base from the gas and into the liquid solution. Suitable Lewis bases for utilization in such method are gaseous Lewis bases such as, for example, CO and $NH_3$.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor processing method of forming a metal-comprising layer over a substrate, comprising:
    providing a semiconductor substrate within a reaction chamber;
    providing a source of a metal-comprising precursor in fluid communication with the reaction chamber, the metal-comprising precursor having a metal coordinated with one or more Lewis bases to form a complex having an undissociated stoichiometric ratio of the one or more Lewis bases to the metal;
    providing at least one of the one or more Lewis bases within the source to a concentration in excess of the stoichiometric ratio;
    transporting at least some of the metal-comprising precursor from the source to the reaction chamber; and
    depositing metal from the metal-comprising precursor onto the semiconductor substrate within the reaction chamber.

2. The method of claim 1 wherein at least some of metal-comprising precursor in the source is a liquid.

3. The method of claim 1 wherein at least one of the one or more the Lewis bases is CO.

4. The method of claim 1 wherein at least one of the one or more Lewis bases comprise nitrogen.

5. The method of claim 1 wherein the metal-comprising precursor comprises the complex $(Y)_xM(Q)_z$; M being the metal; Y being a first ligand, and x being from 0 to 4; Q being the one or more Lewis bases, and z being from 1 to 6.

6. The method of claim 5 wherein Q is selected from the group consisting of CO and $NH_3$.

7. The method of claim 5 wherein Y is a multidentate chelate.

8. The method of claim 5 wherein Y is a diene.

9. The method of claim 1 wherein the metal-comprising precursor comprises the complex $(Y)_xM(CO)_z$, wherein M is the metal, wherein Y is a multidentate chelate, wherein x is from 0 to 4, wherein z is from 1 to 6, and wherein CO is the Lewis base provided within the source to an amount in excess of the stoichiometric ratio of the CO in the complex.

10. The method of claim 1 wherein the metal-comprising precursor comprises the complex (cyclopentadienyl)Rh$(CO)_2$, and wherein CO is provided within the source to an amount in excess of the stoichiometric ratio of the CO in the complex.

11. The method of claim 1 wherein the metal-comprising precursor comprises the complex (1,3-cyclohexadiene)Ru$(CO)_3$, and wherein CO is provided within the source to an amount in excess of the stoichiometric ratio of the CO in the complex.

12. The method of claim 1 wherein the metal is a transition metal.

13. The method of claim 1 wherein the metal is selected from the group consisting of Ru, Os, Rh, Ir and Co.

14. A semiconductor processing method of forming a metal-comprising layer over a semiconductor substrate, comprising:
    providing a semiconductor substrate within a reaction chamber;
    providing a source of a metal-comprising precursor external to the reaction chamber, the metal-comprising precursor comprising a metal coordinated with one or more Lewis bases to form a complex having a stoichiometric ratio of each of the Lewis bases to the metal, at least some of the metal-comprising precursor in the source being a liquid;
    providing a gas having an amount of at least one of the Lewis bases therein;
    passing the gas through the liquid metal-comprising precursor of the source while maintaining the source at a temperature of from about 0° C. to about 100° C.;
    transporting at least some of the metal-comprising precursor from the source to the reaction chamber with the gas; and
    depositing metal from the metal-comprising precursor onto the semiconductor substrate within the reaction chamber.

15. The method of claim 14 wherein the at least one Lewis base is CO.

16. The method of claim 14 wherein the at least one Lewis base comprises nitrogen.

17. The method of claim 14 wherein the metal-comprising precursor comprises at least two Lewis bases, wherein the at least two Lewis bases have different chemical formulas from one another, and wherein only one of the at least two Lewis bases is distributed within the source to an amount in excess of the stoichiometric ratio of said only one Lewis base in the complex.

18. The method of claim 14 wherein the metal-comprising precursor comprises the complex $(Y)_xM(Q)_z$; Y being a first ligand, and x being from 0 to 4; Q being the at least one Lewis base, and z being from 1 to 6.

19. The method of claim 18 wherein Q is selected from the group consisting of CO and $NH_3$.

20. The method of claim 18 wherein Y is a multidentate chelate comprising a diene.

21. The method of claim 14 wherein the metal-comprising precursor comprises the complex (cyclopentadienyl)Rh $(CO)_2$, and wherein CO is distributed within the source to an amount in excess of the stoichiometric ratio of the CO in the complex.

22. The method of claim 14 wherein the metal-comprising precursor comprises the complex (1,3-cyclohexadiene)Ru $(CO)_3$, and wherein CO is the at least one Lewis base distributed within the source to an amount in excess of the stoichiometric ratio of the CO in the complex.

23. The method of claim 14 wherein the at least one Lewis base comprises a double bond that joins a pair of carbon atoms.

24. The method of claim 14 wherein the metal is a transition metal.

25. The method of claim 14 wherein the metal is selected from the group consisting of Ru, Os, Rh, Ir and Co.

26. A method of forming a capacitor, comprising:
forming a conductive diffusion barrier layer over a semiconductor substrate, the forming the diffusion barrier layer comprising:
providing the substrate within a reaction chamber;
providing a source of a metal-comprising precursor external to the reaction chamber, the metal-comprising precursor comprising a metal coordinated with one or more Lewis bases to form a complex having a stoichiometric ratio of each of the Lewis bases to the metal;
providing a gas, and distributing an amount of at least one of the Lewis bases within the gas;
after distributing the at least one of the Lewis bases within the gas, transporting at least some of the metal-comprising precursor from the source to the reaction chamber with the gas; and
depositing metal from the metal-comprising precursor onto the semiconductor substrate within the reaction chamber;
forming a dielectric layer against the diffusion barrier layer; and
forming a second capacitor electrode separated from the diffusion barrier layer by the dielectric layer.

* * * * *